US010002738B1

United States Patent
Farnell et al.

(10) Patent No.: US 10,002,738 B1
(45) Date of Patent: Jun. 19, 2018

(54) SIMPLIFIED FORMATION PROCESS OF A LOW WORK FUNCTION INSERT

(71) Applicant: Colorado State University Research Foundation, Fort Collins, CO (US)

(72) Inventors: Casey Farnell, Fort Collins, CO (US); Cody Farnell, Fort Collins, CO (US); John Williams, Fort Collins, CO (US); Desiree Williams, Fort Collins, CO (US); Bao Gia Nguyen, Fort Collins, CO (US); Kathryn Elizabeth Greiner, Fort Collins, CO (US); Ryan Kenneth Ham, Fort Collins, CO (US)

(73) Assignee: Colorado State University Research Foundation, Fort Collins, CO (US)

(*) Notice: Subject to any disclaimer, the term of this patent is extended or adjusted under 35 U.S.C. 154(b) by 0 days. days.

(21) Appl. No.: 15/466,768

(22) Filed: Mar. 22, 2017

Related U.S. Application Data

(60) Provisional application No. 62/311,744, filed on Mar. 22, 2016.

(51) Int. Cl.
| | |
|---|---|
| *H01J 9/04* | (2006.01) |
| *H05H 1/24* | (2006.01) |
| *B22F 3/11* | (2006.01) |
| *H01J 29/04* | (2006.01) |
| *B22F 3/24* | (2006.01) |

(52) U.S. Cl.
CPC ............... *H01J 29/04* (2013.01); *B22F 3/11* (2013.01); *B22F 3/24* (2013.01); *H05H 1/24* (2013.01); *B22F 2003/247* (2013.01)

(58) Field of Classification Search
CPC .... H01J 29/04; B22F 3/24; B22F 3/11; H05H 1/24
See application file for complete search history.

(56) References Cited

U.S. PATENT DOCUMENTS

| | | | | |
|---|---|---|---|---|
| 3,558,966 A | * | 1/1971 | Hill ........................... | H01J 1/28 313/311 |
| 3,798,492 A | * | 3/1974 | Menelly ................... | H01J 1/30 313/311 |
| 6,420,673 B1 | * | 7/2002 | Nemchinsky ............ | H05H 1/34 219/121.5 |

* cited by examiner

Primary Examiner — Joseph L Williams
(74) Attorney, Agent, or Firm — Maschoff Brennan

(57) ABSTRACT

In an example, a method to form a low work function insert includes preparing a mixture that includes a first powder that contains barium, a second powder that contains calcium, a third powder that contains at least one of aluminum, samarium, or magnesium, and a fourth powder that contains a refractory metal. The method may also include heating the mixture, contained in a crucible, in a furnace. Oxygen concentration in the furnace may be maintained at a low partial pressure during heating of the mixture in the furnace. The low work function of the insert allows electrons to be readily extracted from its surface.

26 Claims, 6 Drawing Sheets

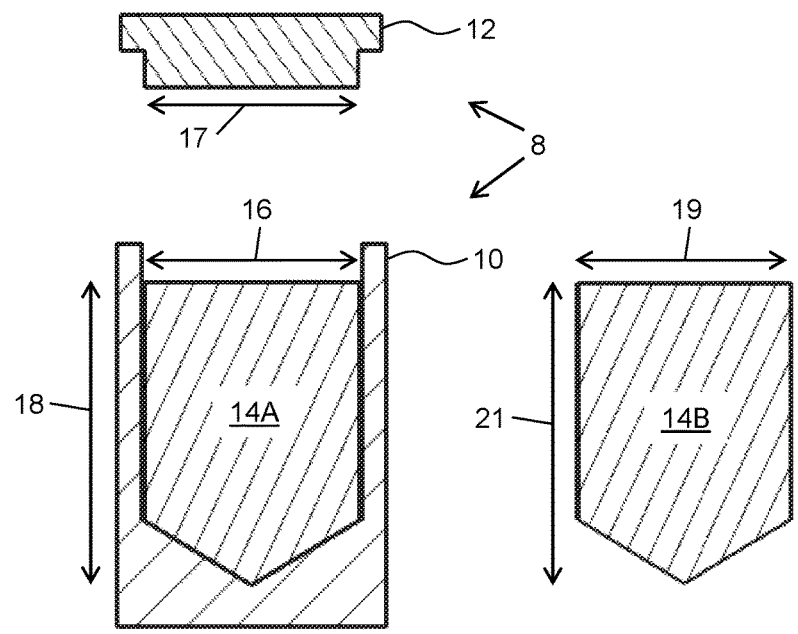
FIG. 2
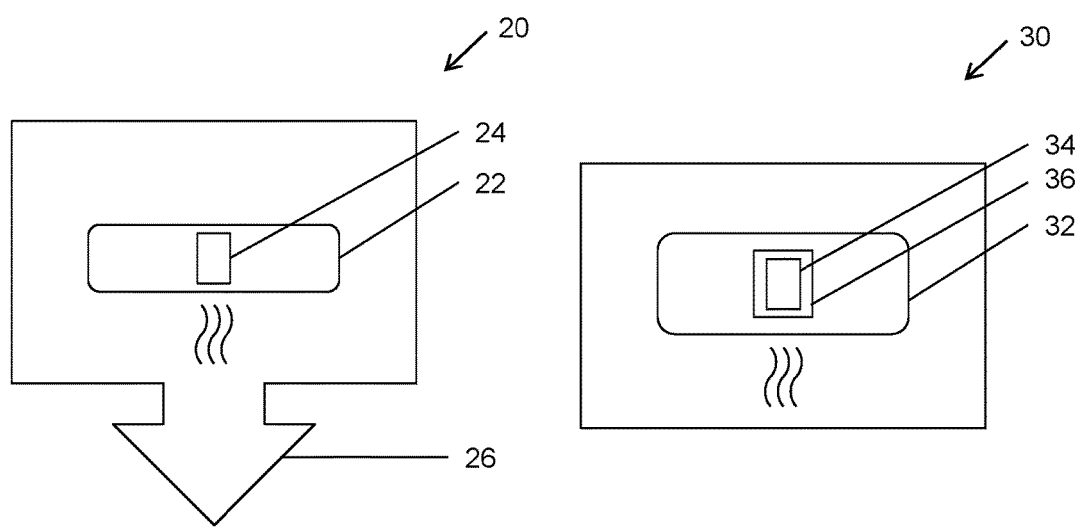
FIG. 3A
FIG. 3B

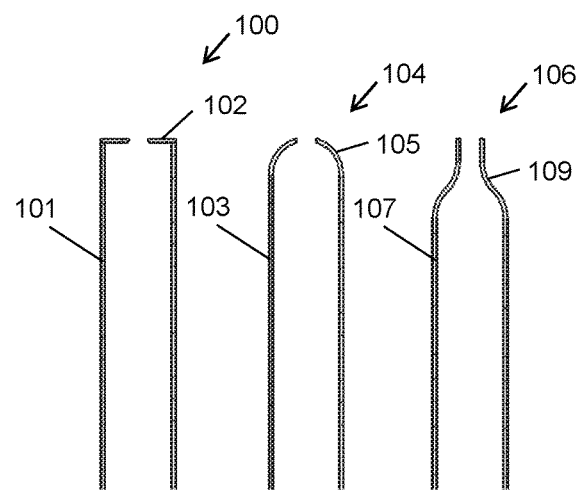
FIG. 8
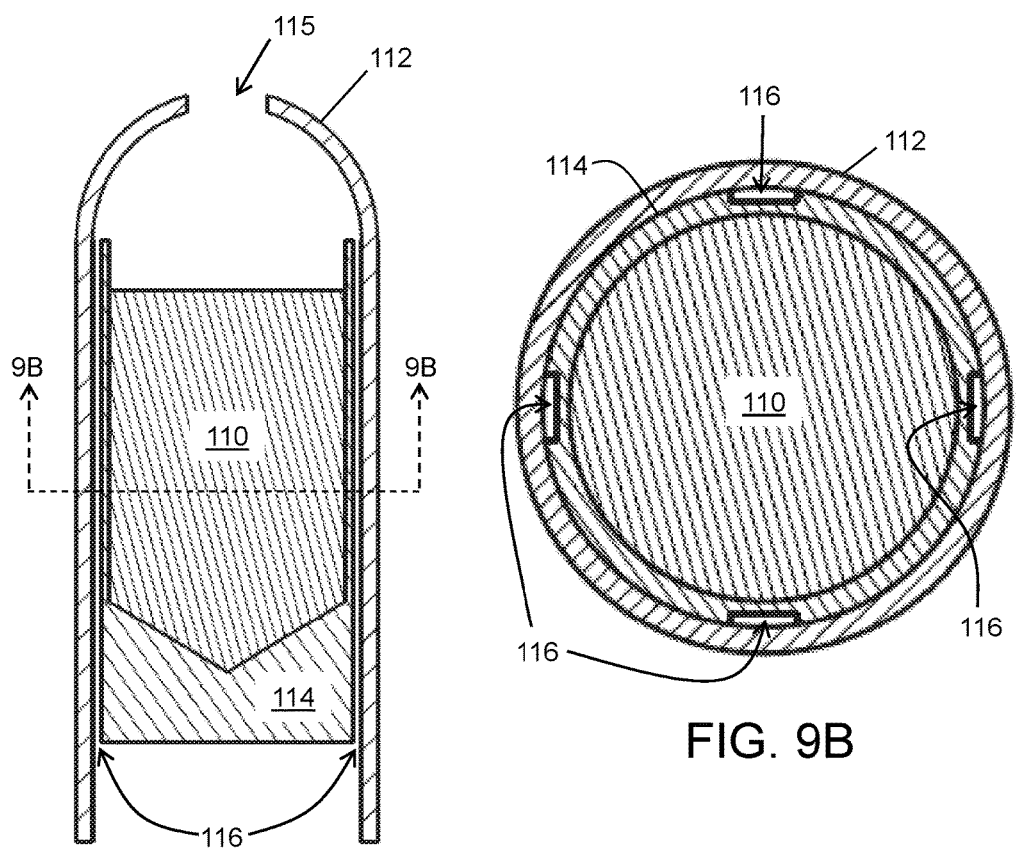
FIG. 9A
FIG. 9B

SIMPLIFIED FORMATION PROCESS OF A LOW WORK FUNCTION INSERT

CROSS-REFERENCE TO RELATED APPLICATION

This application claims the benefit of and priority to U.S. Provisional App. No. 62/311,744, filed Mar. 22, 2016. The foregoing provisional application is incorporated herein by reference.

FIELD

Some embodiments described herein generally relate to a simplified formation process of a low work function insert.

BACKGROUND

Unless otherwise indicated herein, the materials described herein are not prior art to the claims in the present application and are not admitted to be prior art by inclusion in this section.

A hollow cathode device is an electron source used in plasma devices. Within a hollow cathode device, there is an insert, from which electrons are thermionically emitted. One type of insert consists of tungsten that is partially filled with barium oxide, calcium oxide, and aluminum oxide among lesser constituents. Cathode inserts with barium oxide, calcium oxide, and aluminum oxide may be referred to as barium calcium aluminate cathode inserts. Some methods for making barium calcium aluminate cathode inserts involve numerous processing steps.

One type of hollow cathode insert consists of a porous tungsten matrix that is separately prepared to be 70-80 percent dense and 30-20 percent porous with an open pore structure. The porous cavities in the tungsten matrix are filled with a low work function barium-calcium-aluminate ceramic in a high temperature hydrogen furnace where the ceramic is liquefied and then pulled into the pores. The porous tungsten treated this way is referred to as having been impregnated with ceramic. In subsequent operation, a low work function occurs on the surface of the tungsten if a monolayer or partial monolayer of atomic barium and oxygen atoms is present on the tungsten surface. During operation, barium and barium oxide are constantly supplied to the surface of the insert from the pores via the open pore structure. The barium and barium oxide are produced at the pores through chemical reactions between the ceramic and its lesser constituents and with the ceramic and the tungsten walls of the pores. The barium and barium oxide constantly evaporate from the surface of the tungsten as a result of the elevated operating temperature, but the aforementioned constant supply of barium and barium oxide from the interior regions of the insert continuously renew the surface so that the work function remains low. The addition of a small amount of scandium oxide into the ceramic can help convert the barium-calcium-aluminate mixture contained within each pore into barium and barium oxide without the need for intimate contact and chemical reaction with the tungsten walls of the pores.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to a simplified formation process of a low work function insert. Some embodiments described herein additionally relate to low work function inserts prepared according to the simplified formation process and/or to electron sources such as hollow cathode tubes or other electron beam sources that include such low work function inserts.

In some embodiments, a method to form a low work function insert includes preparing a mixture that includes a first powder that contains barium, a second powder that contains calcium, a third powder that contains at least one of aluminum, samarium, or magnesium, and a fourth powder that contains a refractory metal. The method may also include heating the mixture, contained in a crucible, in a furnace. Oxygen concentration in the furnace may be maintained at a low partial pressure during heating of the mixture in the furnace.

In some embodiments, the refractory metal of the fourth powder includes at least one of tungsten, molybdenum, tantalum, iridium, osmium, or titanium.

In some embodiments, the third powder contains aluminum and the fourth powder contains tungsten.

In some embodiments, preparing the mixture includes combining together the first powder, the second powder, and the third powder according to an atomic ratio of barium atoms to calcium atoms to pairs of aluminum atoms of 5:3:2, 4:1:1, 6:1:2 or 3:1:1.

In some embodiments, preparing the mixture includes combining together the first powder, the second powder, the third powder, the fourth powder, and a fifth powder that contains scandium oxide.

In some embodiments, the fourth powder makes up 50% to 95% by weight of an aggregate weight of the mixture.

In some embodiments, the fourth powder makes up 75% to 95% by weight of the aggregate weight of the mixture.

In some embodiments, preparing the mixture includes combining together the first powder, the second powder, the third powder, the fourth powder, and a powder added to the fourth powder that contains at least one additive metal that is different than the refractory metal of the fourth powder, each of the at least one additive metal selected from the group consisting of tungsten, nickel, iridium, osmium, titanium, molybdenum, or tantalum.

In some embodiments, heating the mixture in the furnace comprises heating the mixture in a vacuum furnace, the method further comprising evacuating the vacuum furnace to a pressure of less than $1 \times 10^{-3}$ Torr and maintaining the pressure at less than $1 \times 10^{-3}$ Torr during the heating.

In some embodiments, heating the mixture in the furnace includes: increasing a temperature within the furnace at a first rate from an initial temperature to a peak temperature; maintaining the temperature within the furnace at the peak temperature during a peak temperature hold time; and decreasing the temperature within the furnace at a second rate from the peak temperature to a final temperature.

In some embodiments, increasing the temperature within the furnace at the first rate from the initial temperature comprises increasing the temperature within the furnace at the first rate in a range from 15-35° C. per minute from room temperature; maintaining the temperature within the furnace at the peak temperature during the peak temperature hold time comprises maintaining the temperature within the furnace at the peak temperature within a range from 1400-1750° C. during the peak temperature hold time within a range from 5-60 minutes; and decreasing the temperature within the furnace at the second rate to the final temperature comprises decreasing the temperature within the furnace at the second rate in a range from 10-35° C. per minute to room temperature.

In some embodiments, increasing the temperature within the furnace at the first rate from the initial temperature to the peak temperature comprises continuously increasing the temperature from the initial temperature to the peak temperature without dwelling at any intermediate temperatures between the initial temperature and the peak temperature.

In some embodiments, heating the mixture in the furnace comprises heating the mixture in an air furnace.

In some embodiments, prior to the heating, the method further includes placing the crucible that contains the mixture in a ceramic container with a gas-permeable seal and placing the ceramic container that contains the crucible that contains the mixture in the air furnace.

In some embodiments, preparing the mixture that includes the first powder that contains barium oxide, the second powder that contains calcium oxide, the third powder that contains at least one of aluminum oxide, samarium oxide, or magnesium oxide, and the fourth powder that contains the refractory metal is performed without at least one of: preparing an initial mixture that includes the first powder, the second powder, and the third powder without the fourth powder and preheating the initial mixture; or heating the mixture in a hydrogen atmosphere.

In some embodiments, the heating the mixture converts the mixture from a powder compound to a porous compound and the method further includes removing the porous compound from the crucible; and machining the porous compound to a machined shape, the low work function insert including the porous compound with the machined shape.

In some embodiments, a low work function insert may include a porous compound that includes a refractory metal uniformly distributed with a ceramic that includes multiple different phases. In aggregate the ceramic includes barium oxide, calcium oxide, and another oxide. Each phase of the ceramic may include at least one of the barium oxide, the calcium oxide, or the other oxide. The other oxide may include at least one of aluminum oxide, samarium oxide, or magnesium oxide. The refractory metal may make up at least 50% of the low work function insert by weight.

In some embodiments, the other oxide includes aluminum oxide; the refractory metal includes tungsten; and the refractory metal makes up 75-95% of the low work function insert by weight.

In some embodiments the low work function insert further includes at least one of: scandium oxide; or an additive metal that includes at least one of nickel, iridium, osmium, titanium, molybdenum, or tantalum.

In some embodiments, an electron source may include an electron emitter and a low work function insert coupled to the electron emitter. The low work function insert may include a porous compound that includes a refractory metal uniformly distributed with a ceramic that includes multiple different phases. In aggregate the ceramic includes barium oxide, calcium oxide, and another oxide. Each phase of the ceramic includes at least one of barium oxide, calcium oxide, or the other oxide. The other oxide may include at least one of aluminum oxide, samarium oxide, or magnesium oxide. The refractory metal may make up at least 50% of the low work function insert by weight.

In some embodiments, the electron emitter includes a planar filament and the low work function insert is coupled to a rear surface of the planar filament.

In some embodiments, the electron emitter functions as a thermionic emitter after repeated exposure to air in non-vacuum conditions.

In some embodiments, the electron source includes a plasma electron emission source; the electron emitter includes a cathode tube; and the low work function insert is coupled to an interior surface of the cathode tube.

In some embodiments, the electron source further includes a hollow keeper electrode that surrounds the cathode tube and the low work function insert, the hollow keeper electrode having an inner diameter that exceeds an outer diameter of the cathode tube by less than 1 millimeters (mm).

In some embodiments, the hollow keeper electrode includes a neutral confinement conical keeper orifice plate.

In some embodiments, the electron source further includes a crucible co-fired with the electron emitter and the low work function insert during assembly of the electron source.

Additional features and advantages of the disclosure will be set forth in the description which follows, and in part will be obvious from the description, or may be learned by the practice of the disclosure. The features and advantages of the disclosure may be realized and obtained by means of the instruments and combinations particularly pointed out in the appended claims. These and other features of the present disclosure will become more fully apparent from the following description and appended claims, or may be learned by the practice of the disclosure as set forth hereinafter.

BRIEF DESCRIPTION OF THE DRAWINGS

To further clarify the above and other advantages and features of the present disclosure, a more particular description of the disclosure will be rendered by reference to specific embodiments thereof which are illustrated in the appended drawings. It is appreciated that these drawings depict only typical embodiments of the disclosure and are therefore not to be considered limiting of its scope. The disclosure will be described and explained with additional specificity and detail through the use of the accompanying drawings in which:

FIG. 2 is a cross-sectional view of an example crucible in which a mixture of ceramic constituents and one or more refractory metals may be heated to form a low work function insert;

FIG. 3A illustrates an example vacuum furnace to heat a mixture in a crucible;

FIG. 3B illustrates an example air furnace to heat a mixture in a crucible;

FIG. 8 is a cross-sectional view of three example cathode tubes which may be implemented in the hollow cathode devices of FIGS. 6 and 7;

FIGS. 9A and 9B include cross-sectional views of a low work function insert co-fired with an open-ended crucible cup and a cathode tube.

DETAILED DESCRIPTION OF SOME EXAMPLE EMBODIMENTS

Some embodiments described herein generally relate to a simplified formation process of a low work function insert, as well as to low work function inserts themselves and/or electron sources that include such low work function inserts. In an example implementation, a combination of powders that include barium, calcium, aluminum (or other suitable substitute), tungsten (or other suitable substitute) are mixed in particular ratios and heated in an oxygen poor environment to form a porous, bulk insert. The low work function of the insert allows electrons to be readily extracted from its surface.

Embodiments described herein eliminate many of the steps included in some other methods of making barium calcium aluminate cathode inserts. For instance, embodiments described herein do not require pre-formation of a porous tungsten matrix or heating the porous tungsten matrix with the barium-calcium-aluminate ceramic in a hydrogen atmosphere to liquefy and pull the ceramic into the pores of the porous tungsten matrix.

Reference will now be made to the drawings to describe various aspects of some example embodiments of the disclosure. The drawings are diagrammatic and schematic representations of such example embodiments, and are not limiting of the present disclosure, nor are they necessarily drawn to scale.

Figure 1:
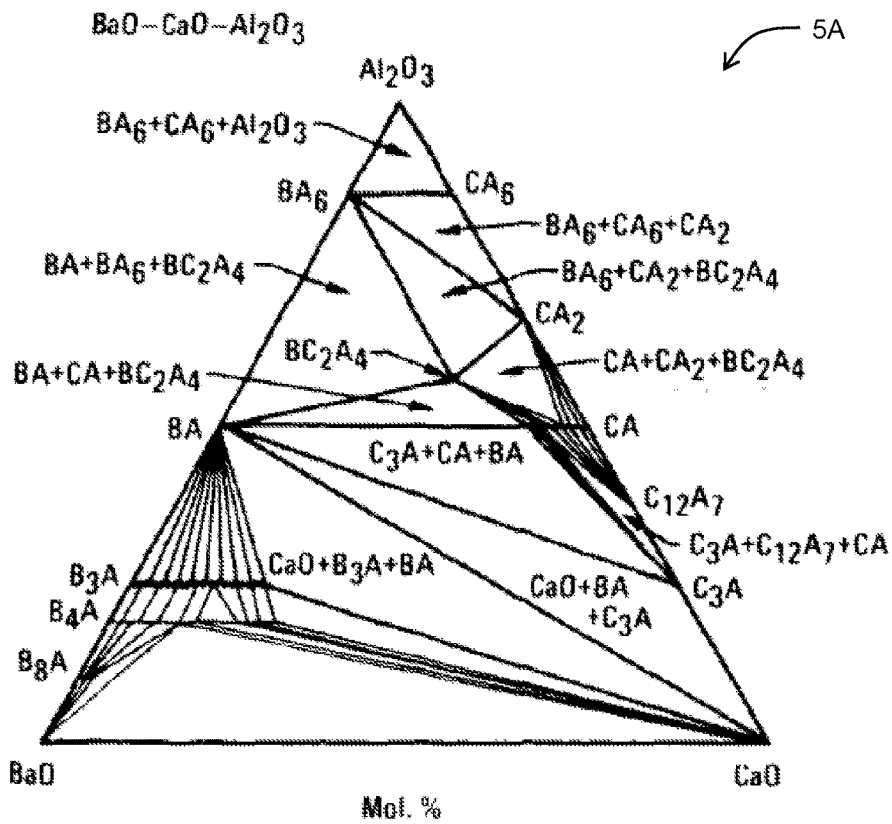
FIG. 1 depicts a ternary plot of the barium oxide, calcium oxide, and aluminum oxide ternary system.
Figure 1:
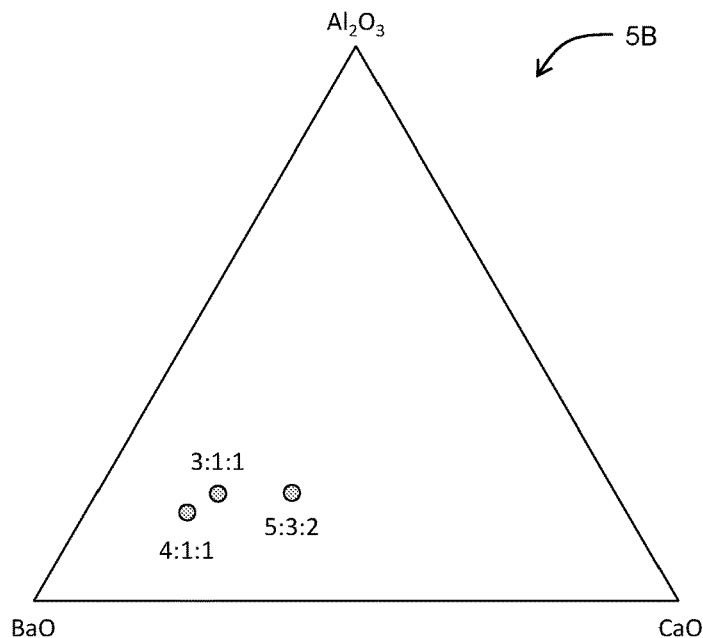

FIG. 1 depicts a ternary plot 5A of the barium oxide (BaO), calcium oxide (CaO), and aluminum oxide ($Al_2O_3$) ternary system with various specific combinations of the foregoing denoted throughout, arranged in accordance with at least one embodiment described herein. Combinations of barium oxide, calcium oxide, and aluminum oxide in one or more suitable ratios are examples of a ceramic that in combination with one or more refractory metals may form a low work function insert which may be made and/or used as described herein. In other embodiments, additives may be included, such as scandium oxide, and/or the aluminum oxide may be replaced with magnesium oxide, samarium oxide, or other suitable oxide.

FIG. 1 additionally depicts a simplified ternary plot 5B with three example starting atomic ratios that may be suitable to form a low work function insert according to some embodiments. For instance, a typical starting atomic mixture ratio of interest is 5 parts barium oxide (BaO), 3 parts calcium oxide (CaO), and 2 parts aluminum oxide ($Al_2O_3$), referred to as a 5:3:2 mixture, which is equivalent to a ratio of barium atoms to calcium atoms to aluminum atoms of 5:3:4. For other ratios described herein and according to the ternary plots 5A and 5B of FIG. 1, it is assumed that aluminum atoms are contributed in pairs (hence the use of "$Al_2O_3$" at the top vertex of the ternary plots 5A and 5B). A low work function insert formed according to such a starting atomic ratio may be referred to as a 5:3:2 insert. Scandium may be added to the ceramic in a small amount, for instance 0.5 parts scandium to the same 5:3:2 mixture of barium, calcium, and paired aluminum to create a 5:3:2:0.5 mixture. Other mixture ratios that may be of interest, and that may be made according to embodiments described herein, are 4:1:1 and 3:1:1, both of which are depicted in the simplified ternary plot 10B of FIG. 1, and/or 6:1:2 or 8:2:3:0.3. Any other suitable mixture ratio may be made according to the embodiments described herein.

Tungsten and the ceramic mixture are combined such that the tungsten may make up 50 to 95 percent by weight of the combined mixture of the tungsten and ceramic mixture. In some embodiments, tungsten and the ceramic mixture are combined such that tungsten makes up 75 to 95 percent by weight of the combined mixture of the tungsten and ceramic mixture. In some embodiments of the invention, other metal powders may be added to the tungsten. For example, iridium as an additive with tungsten may result in lower work functions than tungsten without iridium. Alternatively or additionally, nickel may be included as an additive (e.g., in an amount of 0.5 percent by weight) with tungsten. Other metal powders, such as osmium, titanium, molybdenum, and tantalum may also be used, including in combination with each other and with iridium, and with tungsten.

The above example assumes that tungsten makes up the majority of the metal combined with the ceramic mixture. The metal that makes up all or the majority of the metal combined with the ceramic mixture may be referred to as the primary metal. Tungsten is only one example of a suitable primary metal. More generally, the primary metal that is combined with the ceramic mixture may include any suitable refractory metal, such as tungsten, molybdenum, tantalum, iridium, osmium, or titanium. In these and other embodiments, a metal that is added to the combined mixture of the primary metal and the ceramic mixture may be referred to as an additive metal. The additive metal may include a different metal than the primary metal and may include tungsten, nickel, iridium, osmium, titanium, molybdenum, or tantalum.

In addition, the ceramic mixture is discussed above as including barium oxide, calcium oxide, and aluminum oxide. More generally, the ceramic mixture may include barium, calcium, and a third metal such as aluminum, samarium, or magnesium, with or without additives. The barium, the calcium, and the third metal, with or without any additives, may be referred to in aggregate as the ceramic constituents. The ceramic constituents and one or more refractory metals (e.g., primary metal with or without additive metal(s)) may be combined and/or mixed in any order and it is not necessary that the ceramic constituents be combined and mixed together before being combined with the one or more refractory metals.

In some embodiments, one or more of the ceramic constituents may be included in a corresponding precursor compound. The ceramic mixture and/or the combined mixture may thus include one or more precursor compounds that include one or more corresponding ceramic constituents and/or one or more ceramic constituents not included in one or more corresponding precursor compounds. During heating of the combined mixture, a given precursor compound may decompose into a corresponding oxide and one or more gases. Various example precursor compounds are described elsewhere herein.

Accordingly, a method to form a low work function insert may include preparing a mixture that includes a first powder that contains barium, a second powder that contains calcium, a third powder that contains at least one of aluminum, samarium, or magnesium, and a fourth powder that contains a refractory metal. The mixture may be placed in a crucible, or mixed in place in the crucible, and then heated in the crucible within a furnace where oxygen concentration is maintained at a low partial pressure during heating of the mixture in the furnace. In some embodiments, low partial pressure of oxygen may refer to a partial pressure of oxygen of less than $10^{-3}$ Torr. Heating the mixture may convert the mixture from a powder compound to a porous compound. The porous bulk compound may be solid in the sense that it may be generally firm and stable in three dimensional shape, notwithstanding the porous compound may have some porosity. The porous compound may be removed from the crucible, or left in place in the crucible, and coupled to an electron emitter of an electron source. Alternatively or additionally, the porous compound may be machined to a machined shape after removal from the crucible. Additional details regarding the foregoing and/or other embodiments are described with respect to the Figures that follow.

FIG. 2 is a cross-sectional view of an example crucible 8 in which a mixture 14A of ceramic constituents and one or more refractory metals may be heated to form a low work function insert 14B, arranged in accordance with at least one embodiment described herein. In more detail, in an example embodiment, a barium containing compound, a calcium containing compound, aluminum oxide (or other oxide), scandium (III) oxide (which may be omitted in some embodiments), and tungsten (or other primary and/or additive refractory metal(s)) are mixed in a particular ratio and/or in particular amounts in powder form to form a mixture 14A. The mixture 14A is transferred into a crucible 8. In an example implementation, the crucible 8 is a graphite crucible and will be referred to hereinafter as a graphite crucible; one or more other materials may be used instead of or in addition to graphite for this or other crucibles described herein so long as the one or more materials can withstand heating temperatures as described herein and do not react with the mixture 14A or any of its constituents.

The graphite crucible 8 in FIG. 2 includes a cup 10 and a cap 12. An inner diameter 16 of the cup 10 is slightly larger than an outer diameter 17 of an inset portion of the cap 12, such that a fit of the cap 12 into the cup 10 may be snug, but still gas permeable. The mixture 14A is transferred into the cup 10, such that the mixture 14A at minimum fills the volume of the cup 10 to a point where a bottom of the cap 12 would sit against a top surface of the mixture 14A when the cap 12 is assembled into the cup 10. The cup 10 can be overfilled such that compressing the cap 12 into the 10 cup may also compress the mixture 14A. Any shape crucible may be used so long as the crucible allows effusion of gaseous reaction products. During heating of the mixture 14A in the graphite crucible 10 within a furnace, the mixture 14A as a powder compound may be converted to a porous compound, which may in some embodiments then be removed from the graphite crucible 8 as the low work function insert 14B with a porous, bulk form.

In some embodiments, pressure may be applied by and/or current may flow through the graphite crucible 8 (or other crucibles described herein) during the heating process. For instance, the cap 12 and/or the graphite crucible 8 may be adapted to apply pressure axially, e.g., along the vertical axis of the graphite crucible in FIG. 2, to the mixture 14A and/or to flow current through the mixture 14A during the heating process.

FIG. 3A illustrates an example vacuum furnace 20 to heat a mixture (not visible in FIG. 3A) in a crucible 24, arranged in accordance with at least one embodiment described herein. The crucible 24 may include or correspond to the crucible 8 of FIG. 2. The crucible 24 may contain a mixture of ceramic constituents and one or more refractory metals, such as the mixture of 14A of FIG. 2. The vacuum furnace 20 may generally include a heated section 22 and a vacuum pump 26.

The crucible 24, containing the mixture, is inserted into the heated section 22 of the vacuum furnace 20. In at least one embodiment, the vacuum pump 26 includes a high vacuum pump and is used to evacuate the vacuum furnace 20 to a pressure less than about $1 \times 10^{-3}$ Torr ($1.3 \times 10^{-1}$ Pa) or more generally to a pressure less than a threshold pressure. The heated section 22 of the vacuum furnace 20 may be used to heat the crucible 24 containing the mixture to a peak temperature at a first rate, e.g., by increasing the temperature within the heated section 22 at the first rate from an initial temperature to the peak temperature. The initial temperature may include room temperature, which may generally refer to an ambient temperature in a location at which the vacuum furnace 20 is located. In an example, room temperature may be in a range from 20 to 25° C., or higher or lower. The peak temperature may be in a peak temperature range between 1400 to 1750° C., or higher or lower than the peak temperature range. In some embodiments, the peak temperature range may be between 1500 to 1700° C. The first rate may be in a first heating rate range from 15-35° C. per minute or higher or lower than the first heating rate range. The first rate may be constant as the temperature is increased, or the first rate may vary as the temperature is increased from the initial temperature to the peak temperature.

The temperature of the crucible 24 may be maintained at the peak temperature, or at least in the peak temperature range, for a peak temperature hold time. The peak temperature hold time may be in a range from 5 to 60 minutes. Alternatively, a peak temperature hold time shorter than 5 minutes or longer than 60 minutes may be acceptable. In some embodiments, the peak temperature hold time is in a range from 10 to 30 minutes.

After completion of the peak temperature hold time, the crucible 24 containing the mixture may then be cooled to a final temperature at a second rate, e.g., the temperature may be decreased from the peak temperature to the final temperature at the second rate from the peak temperature to the final temperature. The final temperature may include room temperature or some other temperature. The second rate may be in a second heating rate range from 10-35° C. per minute or higher or lower than the second heating rate range. The second rate may be constant as the temperature is decreased, or the second rate may vary as the temperature is decreased from the peak temperature to the final temperature.

FIG. 3B illustrates an example air furnace 30 to heat a mixture (not visible in FIG. 3B) in a crucible 34, arranged in accordance with at least one embodiment described herein. The crucible 34 may include or correspond to the crucible 8 of FIG. 2. The crucible 34 may contain a mixture of ceramic constituents and one or more refractory metals, such as the mixture of 14A of FIG. 2. The air furnace 30 may generally include a heated section 32.

The crucible 34, containing the mixture, is placed inside a ceramic container 36, after which the ceramic container 36, the crucible 34, and the mixture are inserted into the heated section 32 of the air furnace 30. Analogous to the crucible 34, the ceramic container 36 may include a cup and cap. Both the crucible 34 and the ceramic container 34 may be gas permeable, at least at the interface between the corresponding cup and cap. Enclosing the mixture within both the crucible 34 and the ceramic container 36 and constructing the crucible 34 out of graphite or graphite containing material or other materials that behave similar to graphite (e.g., tantalum, molybdenum, tungsten) may help maintain oxygen concentration in a vicinity of the mixture at a low partial pressure during heating within the air furnace 30.

Analogous to the embodiment of FIG. 3A, in the embodiment of FIG. 3B, the temperature within the air furnace 30 may be increased from an initial temperature to a peak temperature, the temperature may be maintained at the peak temperature during a peak temperature hold time, and the temperature may be decreased from the peak temperature to a final temperature. The initial temperature, the peak temperature, the final temperature, and/or the peak temperature hold time in the embodiment of FIG. 3B may be the same as or different than in FIG. 3A.

The increase and/or decrease of the temperature may be continuous. Alternatively, the increase and/or decrease of the temperature may proceed in a stepwise manner. In an example stepwise implementation, the temperature within the air furnace 30 is increased to a first temperature (e.g., 100° C.) and held at the first temperature for a first hold time (e.g., one minute). This pattern of increasing to a particular temperature and holding at that temperature for a hold time may be repeated a total of N times prior to a final ramp up to a peak temperature. For instance, N may be 6 in which case the temperature may be increased to 100° C., 200° C., 300° C., 400° C., 500° C., and then 600° C. while holding at the corresponding temperature for the hold time before increasing to the next corresponding temperature. The difference between each successive temperature may be 100° C. as in this example, or some other difference and/or may not be the same from one temperature to the next.

After reaching 600° C. (or some other intermediate value between the initial temperature and the peak temperature), the temperature within the air furnace 30 may be increased to 1500-1700° C. (such as 1650° C.) or some other peak temperature and held at the peak temperature for 5 to 60 minutes (such as 30 minutes), or some other peak temperature hold time.

After the peak temperature hold time is over, the temperature within the air furnace 30 may be decreased from the peak temperature to the final temperature. For instance, the air furnace 30 may be turned off to allow the ceramic container 36, the crucible 34, and the mixture contained in the crucible to cool naturally. Alternatively or additionally, the decrease in temperature may be actively controlled by the air furnace 30.

As mentioned above, one or more of the ceramic constituents may be included in a corresponding precursor compound that decomposes under heating to a corresponding oxide and one or more gases. As an example, the barium containing compound may be selected among barium carbonate ($BaCO_3$), barium hydroxide monohydrate ($Ba(OH)_2(H_2O)$), or barium hydroxide octahydrate ($Ba(OH)_2(H_2O)_8$). The calcium containing compound may be selected among calcium carbonate ($CaCO_3$) or calcium hydroxide ($Ca(OH)_2$). During the heating phase (e.g., within the vacuum furnace 20 or the air furnace 30 of FIGS. 3A-3B), barium carbonate may thermally decompose into barium oxide and carbon dioxide ($CO_2$) at temperatures above about 850° C. Similarly, barium hydroxide may thermally decompose into barium oxide at temperatures above about 750° C. Calcium carbonate may thermally decompose into calcium oxide and carbon dioxide at temperatures above about 840° C. Calcium hydroxide may thermally decompose into calcium oxide at temperatures above about 400° C. The rate of decomposition of any of the foregoing precursor compounds may be a function of temperature, and the conversion of barium carbonate or barium hydroxide monohydrate or octahydrate to barium oxide and of calcium carbonate or calcium hydroxide to calcium oxide may occur over several minutes during the heating phase as the temperature rises above the corresponding precursor compound's decomposition point. The gases such as carbon dioxide generated from decomposition may in some cases be constantly evacuated from the heated region 22 in the case of the vacuum furnace 20 after passing through the crucible 24 (e.g., through the gas permeable interface between the cup and cap of the crucible 24). Alternatively, in the case of the air furnace 30, the gases generated from decomposition may pass through the crucible 34, the ceramic container 36, and disperse into and out of the air furnace 30.

Still referring to the heating process, a feature of some embodiments described herein is a one-step process where the barium carbonate, calcium carbonate, and aluminum oxide powders (or other barium-, calcium-, and/or other metal-containing ceramic constituent powders) do not need to be pre-treated in a separate step prior to incorporating them with the tungsten powder (or other primary refractory metal and/or one or more additive metal powders) and the tungsten does not have to be pre-formed into an open porous structure in many separate steps prior to being impregnated with ceramic. For instance, in some other processes to form a low work function insert, the ceramic constituent powders are pre-mixed in the absence of any tungsten and then heated in air to a peak temperature of about 1350° C. for several hours to a) convert barium carbonate and calcium carbonate to barium oxide and calcium oxide and b) form multi-phase solutions of barium, calcium, and aluminum oxide. In such processes, they are re-crushed into a powder and mixed with a binder and then applied to the surface of the open porous tungsten matrix and impregnated into the open porous matrix through a heat treatment process in a wet and then dry hydrogen atmosphere at a temperature of approximately 1800° C.

In some embodiments described herein, however, the barium carbonate, calcium carbonate, and aluminum oxide powders (or other barium-, calcium-, and/or aluminum-containing powders) can be directly mixed with tungsten powder and heated in a single step to form a low work function insert. In other embodiments described herein, a pretreatment may be performed, such as by first treating the barium-, calcium-, and aluminum-containing powders at 1350° C. in air for several hours in the absence of tungsten, then mixing those powders with tungsten powder, and then heating the powdered mixture to form a porous low work function insert; still without the hydrogen atmosphere impregnation step or the porous tungsten matrix formation step followed by a separate ceramic impregnation step of some other low work function insert formation processes.

Referring back to the graphite crucible 8 of FIG. 2, and as already mentioned, after the heating process the powdered mixture 14A may be converted into a porous compound as the low work function insert 14B that, in this example, may contain a multiphase ceramic (made up of barium oxide, calcium oxide, aluminum oxide, and scandium oxide) uniformly distributed with tungsten. Different regions of the low work function insert 14B may include different phases of the ceramic. The porous compound low work function insert 14B may typically be lightly adhered to surfaces of the graphite cup 10 and graphite cap 12 of the graphite crucible 8, and may be separated with gentle tapping or by running a sharp blade around the interface between the low work function insert 14B and the graphite cup, or in any other suitable manner. An outer diameter 19 of the low work function insert 14B may be the same or nearly the same as the inner diameter 16 of the cup 10. Similarly, a height 21 of the low work function insert 14B may be the same or nearly the same as a height 18 of the enclosed space between the bottom of the cap 12 and the bottom of the cup 10 when the graphite crucible 8 is closed.

In some ceramic-impregnated low work function inserts, all the tungsten or other refractory metal is interconnected to itself as a result of forming the porous tungsten matrix first, follow by impregnation with ceramic. As such, any two points on an exterior surface of the low work function insert as a whole may be interconnected on the surface by a continuous run (however indirect) of tungsten. In comparison, low work function inserts according to embodiments described herein may have discontinuous regions of tungsten or other refractory metal such that any two points on an exterior surface of such low work function inserts may not be interconnected on the surface by a continuous run of tungsten as a result of the different low work function formation process described herein.

Figure 4:
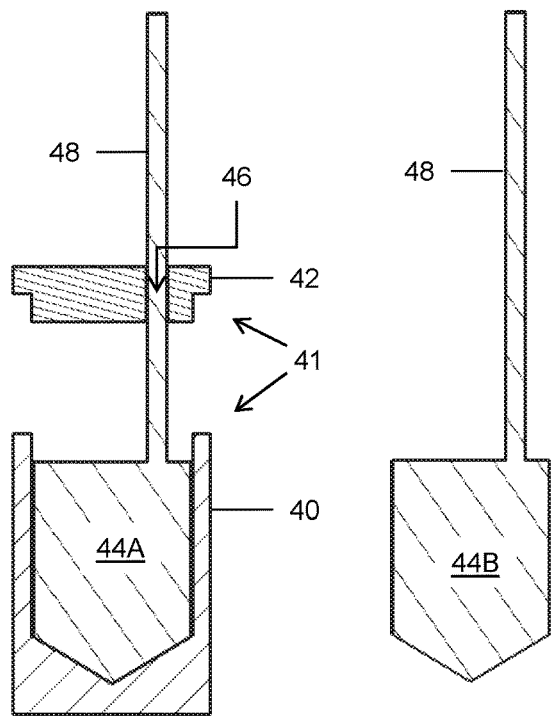
FIG. 4 is a cross-sectional view of another example crucible in which a mixture of ceramic constituents and one or more refractory metals may be heated to form a low work function insert with one or more embedded wires or leads.

In some embodiments, a low work function insert may be formed with an embedded wire. For instance, FIG. 4 is a cross-sectional view of another example crucible 41 in which a mixture 44A of ceramic constituents and one or more refractory metals may be heated to form a low work function insert 44B with one or more embedded wires or electrical leads 48 (hereinafter "wire 48"), arranged in accordance with at least one embodiment described herein.

The crucible 41 includes a cup 40 and a cap 42. The cup 40 and the cap 42 may generally by similar to the cup 10 and cap 12 of FIG. 2, except that the cap 42 defines a hole 46. Prior to heating the crucible 41 and the mixture 44A in a furnace, the wire 48 (or a collection of multiple wires) may be passed through the hole 46 of the cap 42 and into the mixture 44A. During the heating process, the wire 48 becomes embedded into the solidified porous low work function insert 44B. Although a single hole 46 is depicted in FIG. 4, more generally the cap 42 may define any number of holes 46, each of which may accommodate one or more wires or leads.

The wire 48 may be made of tantalum, tungsten, or other metals or materials. In embodiments that include the wire 48 embedded in the low work function insert 44B, the wire 48 may be welded to a cathode tube or other electron emitter to both a) make good electrical contact between the cathode tube and the low work function insert 44B, and b) hold or otherwise secure the low work function insert 44B in a specific location along an axial length of the cathode tube. More particularly, the low work function insert 44B may be secured relative to the cathode tube such that there is a specific distance between a downstream surface of the low work function insert 44B and an upstream surface of a cathode tube orifice of the cathode tube.

Figure 5:
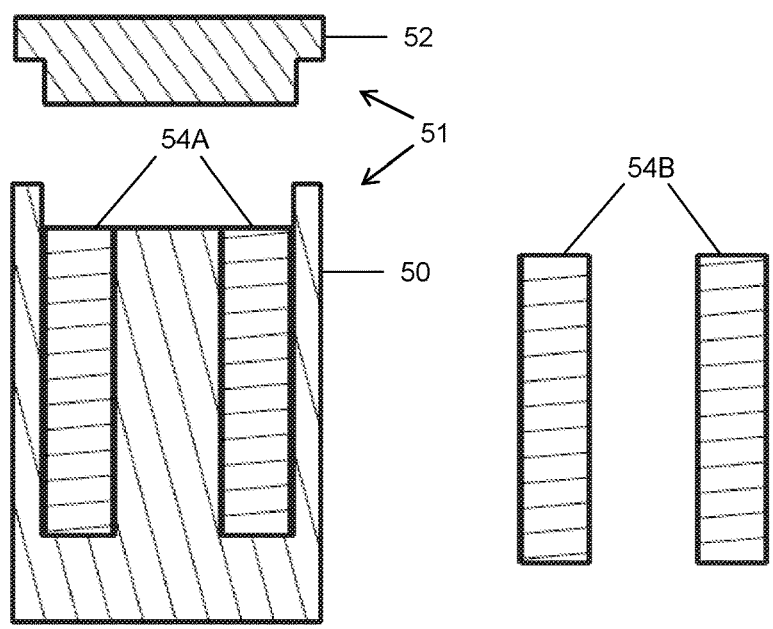
FIG. 5 is a cross-sectional view of another example crucible in which a mixture of ceramic constituents and one or more refractory metals may be heated to form a low work function insert.

FIG. 5 is a cross-sectional view of another example crucible 51 in which a mixture 54A of ceramic constituents and one or more refractory metals may be heated to form a low work function insert 54B, arranged in accordance with at least one embodiment described herein. The crucible 51 includes a cup 50 and a cap 52, which may generally be similar or analogous to the cup 10 and cap 12 of FIG. 2. In the example of FIG. 5, however, the cup 50 defines a tubular volume filled by the mixture 54A in FIG. 5. After the heating process is performed, a porous compound is formed in a tubular shape as the low work function insert 54B. The cap 52 may lack any holes similar to the cap 12 of FIG. 2. Alternatively, the cap 52 may define one or more holes, similar to the cap 42 of FIG. 4, to accommodate one or more wires to be embedded in the low work function insert 54B. In the examples of FIGS. 2, 4, and/or 5, a plug- or ingot-shaped low work function insert 14B or 44B and/or a tubular-shaped low work function insert 54B may be formed with or without one or more embedded wires 48 in a single heating step or at least in fewer heating steps than in other low work function insert formation processes that involve a previously formed porous tungsten piece impregnated with ceramic.

Figure 6:
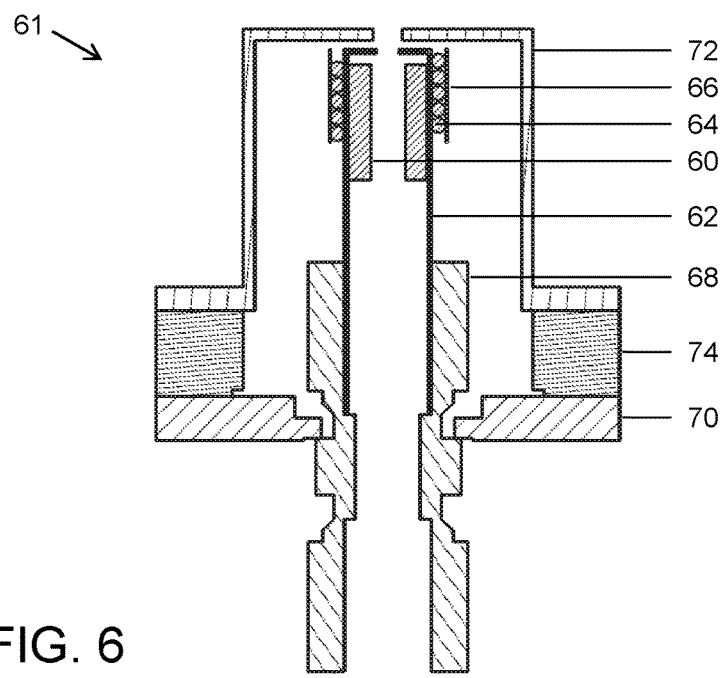
FIG. 6 is a cross-sectional view of an example hollow cathode device that may include a low work function insert.

FIG. 6 is a cross-sectional view of an example hollow cathode device 61 that may include a low work function insert 60, arranged in accordance with at least one embodiment described herein. The hollow cathode device 61 may include the low work function insert 60, a cathode tube 62, a heater wire 64, a radiation foil 66, a compression fitting 68, a mounting structure 70, a keeper electrode 72, and an insulator 74.

The low work function insert 60 may generally be formed according to one or more of the processes described herein and/or may generally include or correspond to the low work function inserts 14B, 44B, 54B described herein. In particular, the low work function insert 60 in FIG. 6 has a tubular shape, similar to the low work function insert 54B of FIG. 5.

The low work function insert 60 is positioned near a downstream end of the cathode tube 62 in FIG. 6, which cathode tube 62 may be thin-walled in some embodiments. The coaxial heater wire 64 is wrapped around the downstream end of the cathode tube 62 to pre-heat the low work function insert 60 prior to device ignition. The radiation foil 66 is wrapped around the coaxial heater wire 64, or in the absence of the heater wire 64 may be wrapped around the downstream end of the cathode tube 62. Neither the heater wire 64 nor the radiation foil 66, however, are required to operate hollow cathode devices with the low work function inserts made according to the embodiments described herein. The cathode tube 62 is attached to the mounting structure 70, for example using the compression fitting 68. Downstream of the cathode tube 62 is the keeper electrode 72. The keeper electrode 72 is electrically isolated from the cathode tube 62 using the insulator 74.

The cathode tube 62 may include tantalum, tungsten, molybdenum, molybdenum-rhenium, or titanium, or any combination thereof. The heater wire 64 may be made of tantalum arranged in a coaxial manner with a high temperature ceramic insulator between an outer heater sheath and an inner central wire often referred to as a filament 62, even though this filament is entirely enclosed within the heater outer sheath and ceramic insulator. The keeper electrode 72 may include graphite. The insulator 74 may include alumina ceramic, steatite ceramic, macor ceramic, or boron nitride. The mounting structure 70 and the compression fitting 68 may include stainless steel or titanium. The keeper electrode 72 may include graphite because graphite has a low sputter yield. More generally, the keeper electrode 72 may include one or more of tantalum, molybdenum, tungsten, titanium, or stainless steel. There may be a set gap between the downstream end of the low work function insert 60 and the downstream end of the cathode tube 62, and another set gap between the downstream end of the cathode tube 62 and the downstream end of the keeper electrode 72. As an example, the set gap between the downstream end of the low work function insert 60 and the downstream end of the cathode tube 62 may be in a range from 1 mm to 3 mm, or less than 1 mm or greater than 3 mm. As another example the set gap between the downstream end of the cathode tube 62 and the downstream end of the keeper electrode 72 may be in a range from 2 mm to 5 mm, or less than 2 mm or greater than 5 mm.

For low work function inserts formed in crucibles as described with respect to e.g., FIGS. 2-5, it is not necessary to separate the low work function insert from the crucible before using the insert in a hollow cathode device such as the hollow cathode device 61 of FIG. 6. In these and other embodiments, the crucible cup containing the low work function insert, with an exposed area of the low work function insert surface on its downstream end, can be placed within the cathode tube. Additionally, the low work function insert may include embedded wires as in FIG. 4 and realize the benefits of the wires as in the case where the low work function insert and crucible are separated.

With continued reference to FIG. 6, process gas may flow into an upstream end (bottom end in FIG. 6) of the cathode tube 62, through a downstream orifice of the cathode tube 62, and exits through an orifice of the keeper electrode 72. A combination of momentary high gas flow in some embodiments of between 25 and 50 standard cubic centimeters per minute (sccm) and high voltage biasing in some embodiments between 400 and 1800 volts (V) allows the hollow cathode device 61, using the low work function insert 60 or other low work function inserts as described herein, to start readily in the absence of the use of the heater wire 64 to pre-heat the cathode tube 62. To ignite plasma discharge regions within the cathode tube 62 and downstream of the cathode tube 62, a high positive voltage, on the order of 400 to 1800 V, is applied to the keeper electrode 72 relative to a voltage of the cathode tube 62. In conjunction with the high voltage bias, a high level of gas flow is momentarily sent through the cathode tube 62 and therefore into a region between the cathode tube orifice and the keeper electrode 72. The momentary high level of gas flow can be created, for example, using a mass flow controller capable of high flow rate, or by quickly releasing a stored mass of gas into the cathode tube 62. A plasma discharge starts between the cathode tube 62 and the keeper electrode 72, and the electron current flowing to the keeper electrode 72 is immediately regulated to a fixed value, typically 200 to 2,000 milliamps (mA), at a reduced voltage bias. In a relatively short period of time of between fractions of a second to several seconds, the plasma discharge heats the cathode tube 62, and the low work function insert 62 within the cathode tube 62, to a temperature at which significant thermionic electron emission occurs. A second voltage bias may be applied sequentially or simultaneously to the keeper electrode 72 bias between the cathode tube 62 and an anode surface that is external to the hollow cathode device 61 to draw electrons through the orifice of the keeper electrode 72. The electron current flowing from the cathode device 61 is then also typically current regulated, at reduced voltage bias, to a value of many amperes. Additional details regarding some example hollow cathode devices that may be implemented with low work function inserts as described herein are described in U.S. Pat. No. 9,305,733 (hereinafter the '733 patent), which is incorporated herein by reference.

Figure 7:
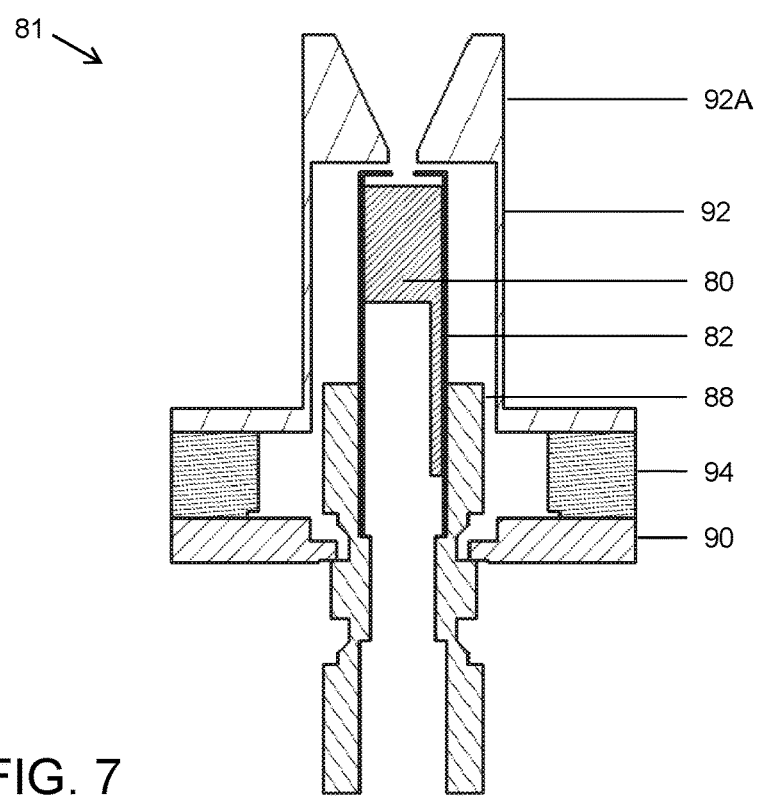
FIG. 7 is a cross-sectional view of another example hollow cathode device that may include a low work function insert.

FIG. 7 is a cross-sectional view of another example hollow cathode device 81 that may include a low work function insert 80, arranged in accordance with at least one embodiment described herein. The hollow cathode device 81 may include the low work function insert 80, a cathode tube 82, a compression fitting 88, a mounting structure 90, a keeper electrode 92, and an insulator 74.

The low work function insert 80, the cathode tube 82, the compression fitting 88, the mounting structure 90, the keeper electrode 92, and the insulator 74 of FIG. 7 may be the same as or similar to similarly named components of FIG. 6, except as otherwise noted. For instance, the low work function insert 80 of FIG. 7 is illustrated as a porous insert with an embedded wire 82, which may be used to electrically couple the low work function insert 80 to the cathode tube 82 and/or to secure the low work function insert 80 to the cathode tube 82 at a particular position longitudinally along the length of the cathode tube 82.

As another example, compared to the keeper electrode 72 of FIG. 6, the keeper electrode 92 of FIG. 7 may have a smaller inner diameter such that the keeper electrode 92 fits more closely around the cathode tube 82 compared to FIG. 2. In FIG. 7, a heater wire and radiation foil have been omitted, which permits the keeper electrode 92 to have the smaller inner diameter compared to the keeper electrode 72 of FIG. 7. In these and other embodiments, the inner diameter of the keeper electrode 92 may exceed the outer diameter of the cathode tube 82 by less than 1 mm, which may not be possible in embodiments that include a heater wire and/or radiation foil.

As further illustrated in FIG. 7, the keeper electrode 92 of FIG. 7 includes a neutral confinement conical keeper orifice plate 92A (hereinafter "neutral confinement plate 92A") at its downstream end. Alternatively, the neutral confinement plate 92A may have a shape other than conical, such as cylindrical, or some other shape. The neutral confinement plate 92A may confine neutral gas particles that flow out through the cathode tube 82 and keeper electrode 92 orifices along with the electrons that pass through these regions to an anode structure located in regions beyond the keeper electrode 92. The extended conical feature of the neutral confinement plate 92A may serve to enhance neutral particle density in this region and enhance the plasma production rate here, which may serve to enhance the ability of the cathode tube 82 to emit electrons to an anode structure located in regions beyond the keeper electrode 92. Additional details regarding some example keeper electrodes with neutral confinement features are described in the '733 patent, which is incorporated herein by reference.

Still referring to FIG. 7, in some embodiments, the neutral confinement plate 92A may deter downstream gas, which may be present outside of the hollow cathode device 81, from backstreaming into the cathode tube 82. In particular, the extended conical shape of the neutral confinement plate 92A may deter oxygen and/or other harmful gasses from traveling through the keeper orifice region into the cathode tube 82 from downstream of the hollow cathode device 81.

Additional details regarding some example keeper electrodes with neutral confinement features are described in the '733 patent, which is incorporated herein by reference.

FIG. 8 is a cross-sectional view of three example cathode tubes 100, 104, 106 which may be implemented in, for instance, the hollow cathode devices 61, 81 of FIGS. 6 and 7, arranged in accordance with at least one embodiment described herein. More generally, the cathode tubes 100, 104, 106 may be implemented as the cathode tube in virtually any hollow cathode device together with a low work function insert as described herein.

The cathode tube 100 is illustrated in FIG. 8 as a tube 101 with an end plate 102 having an orifice with a smaller diameter than the end plate. The end plate 102 may be welded to or otherwise secured to or integrally formed in the tube 101 to form the cathode tube 100. The tube 101 may include tantalum and the end plate 102 may include either tantalum or tungsten. Other materials may be used for either or both of the tube 101 or the end plate 102, such as molybdenum, molybdenum-rhenium, and titanium.

The cathode tube 104 may include a tantalum tube 103 with its 105 end formed into a rounded shape, for example using metal spinning, thereby forming an orifice of a desired size. An advantage of tantalum may be that it is sufficiently malleable such that the tube 103 can be formed to have a small sized orifice at its end 105.

The cathode tube 106 may include a tantalum tube 107 with its end 109 formed into an elongated length of desired cross section. Other metals such as molybdenum, molybdenum-rhenium, and titanium can be used in place of the tantalum tube 107 for forming the rounded or elongated cathode tube 106 in any suitable manner (e.g., directly, machining, or other formation process) although it may be more difficult to form these relatively more brittle materials into the rounded or elongated cathode tube shape compared to tantalum. An advantage of the elongated shape of the end 109 of the cathode tube 106 may be that it deters downstream gas—that can be present outside of the hollow cathode device—from backstreaming into the cathode tube 106. In particular, the elongated shape at the end 109 of the cathode tube 106 may deter oxygen or other harmful gasses from traveling into the cathode tube 106 from downstream of the hollow cathode device. Numerous other formed variations of the downstream end of cathode tubes implemented according to some embodiments described herein can be envisioned that give an orifice of a particular size and/or shape.

Another advantage that may arise from a shaped cathode tube may be that it can be shaped such that when a corresponding low work function insert is placed within the cathode tube, the geometry of the cathode tube and insert may fix the location of the low work function insert at a particular distance from the downstream end of the cathode tube. As mentioned previously, if one or more wires are embedded into the low work function insert during its formation process, the one or more wires can be used to fix the low work function insert location as a result of welding or otherwise securing the wires to the cathode tube. The low work function insert can be alternatively located by press-fitting it into the cathode tube, or by crimping the cathode tube at one or more locations upstream, along the length of, or downstream of the low work function insert after the low work function insert is installed.

FIGS. 9A and 9B include cross-sectional views of a low work function insert 110 co-fired with an open-ended crucible cup 114 and a cathode tube 112, arranged in accordance with at least one embodiment described herein. In this and other embodiments, a mixture of ceramic constituents and one or more refractory metals as described herein may first be loaded into the open-ended crucible cup 114, which may be inserted with the mixture into the cathode tube 112 in a vertical orientation such that the mixture is retained within the cup 114 via gravity. A location of the cup 114 within the cathode tube 112 may then fixed, for instance by press-fitting it into the cathode tube 112, or by crimping the cathode tube 112 at one or more locations, upstream, along the length of, or downstream of the cup 114. The resulting assembly, including the mixture, the cup 114, and the cathode tube 112, finally undergoes the aforementioned heating process to solidify the mixture into the porous low work function insert 110. The cup 114 may have one or more open pathways 116 along its length that allow gas to flow within the cathode tube from upstream of the cup 114 to the region near the open-end of the cup 114 and finally through an cathode tube orifice 115. Any number or shape of pathways 116 may be used so long as they allow gas to flow through the cathode tube 112 and past the cup 114.

The example of FIG. 9A may simplify the assembly/manufacturing process for a hollow cathode device by eliminating a step of removing the low work function insert 110 from the cup 114. In other embodiments such as illustrated in FIGS. 6 and 7, low work function inserts may be in direct contact with the corresponding cathode tube, which may be made of metal. In comparison, some low work function inserts made of lanthanum hexaboride ($LaB_6$) cannot be placed directly against the cathode or other metal or such low work function inserts may be contaminated, requiring such low work function inserts to be encased in graphite or other material.

Embodiments of the low work function inserts described herein may be used in traveling wave tubes, electron beam evaporating apparatuses, or other electron sources. For instance, 3D metal printers with powder or wire fed printing media may include tantalum filaments or tungsten-based filaments. Although filaments are commonly envisioned as thin circular wire, some filaments may be generally planar and in some cases may have a generally disc shape with leads. Alternatively or additionally, such generally planar filaments may be stamped or otherwise formed into complex shapes. Low work function inserts as described herein may be coupled directly to or near such filaments or other electron emitters to lower their work function. An example of such a filament with a low work function insert is illustrated in FIG. 10.

Figure 10:
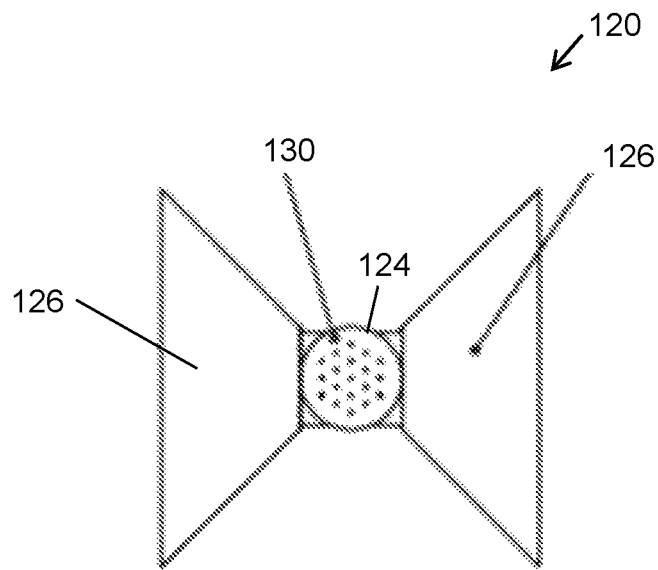
FIG. 10 includes both an overhead view and a cross-sectional elevation view of an electron source implemented as a filament, all arranged in accordance with at least one embodiment described herein.
Figure 10:
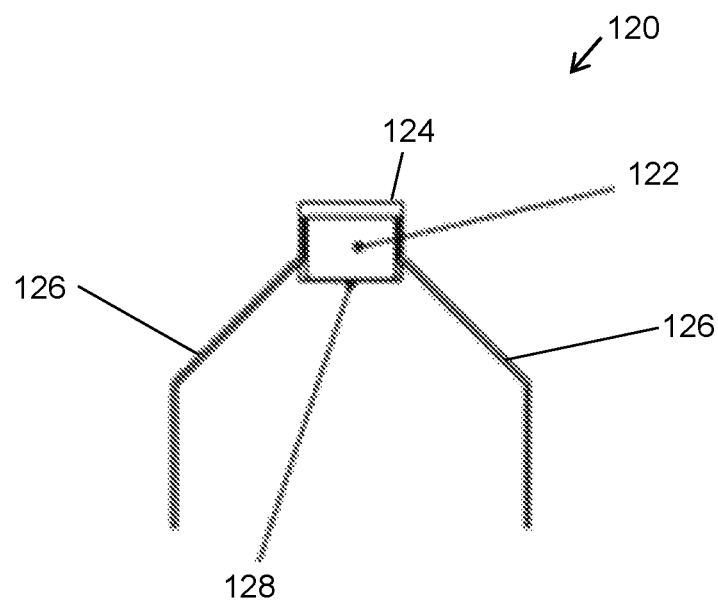

In more detail, FIG. 10 includes both an overhead view (top of FIG. 10) and a cross-sectional elevation view (bottom of FIG. 10) of an electron source implemented as a filament 120, arranged in accordance with at least one embodiment described herein. The filament 120 may be included in an electron source such as a 3D metal printer or other electron source together with a low work function insert 122 that may be similar or identical to other low work function inserts described herein. As illustrated, the filament 120 includes a generally planar disc or button 124 with leads 126.

The low work function insert 122 may be retained beneath the button 124 by a retainer element 128. The retainer element 128 may include tantalum foil. One or more holes 130 may be formed in the button 124 to permit barium from the low work function insert 122 to migrate, e.g., via surface diffusion processes, through the one or more holes 130 to an exterior surface of the button 124. The presence of the barium from the low work function insert 122 may reduce the work function of the filament 120.

In some embodiments, electron emitters with low work function inserts such as the filament 120 with the low work function insert 122 may be experience little or no degradation in thermionic electron emission performance after repeated exposure to air in non-vacuum conditions. As used herein, non-vacuum conditions may mean that attempts are not actively made to evacuate air. In these and other embodiments, such electron emitters with low work function inserts may generally be operated in a vacuum and may be cooled to 150° C. or below before being exposed to air and then returned to vacuum for subsequent operation. In comparison, some electron emitters with ceramic impregnated porous tungsten inserts may experience significant degradation in thermionic electron emission performance with each exposure to air.

Barium generated during operation from low work function inserts formed according to some embodiments described herein may coat other nearby surfaces that may typically be made of tantalum, molybedenum, tungsten, moly-rhenium, and/or other refractory materials or alloys. The barium often finds an oxygen atom on these nearby surfaces and forms a dipole that can reduce the work function of these nearby surfaces. Hence electron emission might occur off the nearby surfaces, and it is possible that more or all of the electron emission might occur off these nearby surfaces. In this manner, some embodiments of the low work function inserts described herein may serve as a reservoir of barium. Thus, such low work function inserts might be considered both a dispenser and/or a reservoir, and the low work function inserts described herein may be implemented as either or both.

The tungsten or other metals used to form low work function inserts as described herein may include 325 mesh (particles of about 40-45 micrometers in size), 2500 mesh (particles of about 4 micrometers in size), or any other mesh powdered tungsten and/or other metals.

When mixing the ceramic constituents (e.g., as oxides and/or oxide precursor compounds) and/or refractory metal(s), one or more mixing techniques may be applied, such as ball milling, sonication in water or alcohol, addition of polyvinyl binder(s), addition of lubricant(s), mortar and pestle, and/or other techniques.

The instant application describes techniques to make barium calcium aluminate (or other) low work function inserts by mixing and heating powders with or without embedded wires in a single step process. Low work function inserts made according to such techniques may be used in hollow cathode devices, traveling wave tubes, electron beam-based 3D metal printers, electron beam evaporating apparatuses, or other electron sources. Such hollow cathode devices may be used to produce electron beams, and support the production of plasma for ion sources, ion thrusters, end-Hall plasma sources, Hall-effect thrusters, and for plasma neutralization to list just a few applications.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method to form a low work function insert, the method comprising:
preparing a mixture that includes a first powder that contains barium, a second powder that contains calcium, a third powder that contains at least one of aluminum, samarium, or magnesium, and a fourth powder that contains a refractory metal; and
heating the mixture, contained in a crucible, in a furnace, wherein oxygen concentration is maintained at a low partial pressure during heating of the mixture in the furnace.

2. The method of claim 1, wherein the refractory metal of the fourth powder includes at least one of tungsten, molybdenum, tantalum, iridium, osmium, or titanium.

3. The method of claim 1, wherein the third powder contains aluminum, and the fourth powder contains tungsten.

4. The method of claim 3, wherein preparing the mixture includes combining together the first powder, the second powder, and the third powder according to an atomic ratio of barium atoms to calcium atoms to paired aluminum atoms of 5:3:2, 4:1:1, 6:1:2, or 3:1:1.

5. The method of claim 1, wherein preparing the mixture includes combining together the first powder, the second powder, the third powder, the fourth powder, and a fifth powder that contains scandium oxide.

6. The method of claim 1, wherein the fourth powder makes up 50% to 95% by weight of an aggregate weight of the mixture.

7. The method of claim 6, wherein the fourth powder makes up 75% to 95% by weight of the aggregate weight of the mixture.

8. The method of claim 1, wherein preparing the mixture includes combining together the first powder, the second powder, the third powder, the fourth powder, and a powder added to the fourth powder that contains at least one additive metal that is different than the refractory metal of the fourth powder, each of the at least one additive metal selected from the group consisting of tungsten, nickel, iridium, osmium, titanium, molybdenum, or tantalum.

9. The method of claim 1, wherein heating the mixture in the furnace comprises heating the mixture in a vacuum furnace, the method further comprising evacuating the vacuum furnace to a pressure of less than $1\times10^{-3}$ Torr and maintaining the pressure at less than $1\times10^{-3}$ Torr during the heating.

10. The method of claim 1, wherein heating the mixture in the furnace includes:
increasing a temperature within the furnace at a first rate from an initial temperature to a peak temperature;
maintaining the temperature within the furnace at the peak temperature during a peak temperature hold time; and
decreasing the temperature within the furnace at a second rate from the peak temperature to a final temperature.

11. The method of claim 10, wherein:
increasing the temperature within the furnace at the first rate from the initial temperature comprises increasing the temperature within the furnace at the first rate in a range from 15-35° C. per minute from room temperature;
maintaining the temperature within the furnace at the peak temperature during the peak temperature hold time comprises maintaining the temperature within the furnace at the peak temperature within a range from 1400-1750° C. during the peak temperature hold time within a range from 5-60 minutes; and
decreasing the temperature within the furnace at the second rate to the final temperature comprises decreasing the temperature within the furnace at the second rate in a range from 10-35° C. per minute to room temperature.

12. The method of claim 10, wherein increasing the temperature within the furnace at the first rate from the initial temperature to the peak temperature comprises continuously increasing the temperature from the initial temperature to the peak temperature without dwelling at any intermediate temperatures between the initial temperature and the peak temperature.

13. The method of claim 1, wherein heating the mixture in the furnace comprises heating the mixture in an air furnace.

14. The method of claim 13, further comprising, prior to the heating, placing the crucible that contains the mixture in a ceramic container with a gas-permeable seal and placing the ceramic container that contains the crucible that contains the mixture in the air furnace.

15. The method of claim 1, wherein the preparing the mixture that includes the first powder that contains barium, the second powder that contains calcium, the third powder that contains at least one of aluminum, samarium, or magnesium, and the fourth powder that contains the refractory metal is performed without at least one of:
preparing an initial mixture that includes the first powder, the second powder, and the third powder without the fourth powder and preheating the initial mixture; or
heating the mixture in a hydrogen atmosphere.

16. The method of claim 1, wherein the heating the mixture converts the mixture from a powder compound to a porous compound, the method further comprising:
removing the porous compound from the crucible; and
machining the porous compound to a machined shape, the low work function insert comprising the porous compound with the machined shape.

17. A low work function insert, comprising:
a porous compound comprising a refractory metal uniformly distributed with a ceramic that includes, in aggregate, barium oxide, calcium oxide, and an other oxide, wherein:
the other oxide includes at least one of aluminum oxide, samarium oxide, or magnesium oxide; and
the refractory metal makes up at least 50% of the low work function insert by weight.

18. The low work function insert of claim 17, wherein:
the other oxide includes aluminum oxide;
the refractory metal comprises tungsten; and
the refractory metal makes up 75-95% of the low work function insert by weight.

19. The low work function insert of claim 18, wherein at least one of:
the ceramic further includes scandium oxide; or
the low work function insert further comprises an additive metal that includes at least one of nickel, iridium, osmium, titanium, molybdenum, or tantalum.

20. An electron source, comprising:
an electron emitter; and
a low work function insert coupled to the electron emitter, the low work function insert comprising:
a porous compound comprising a refractory metal uniformly distributed with a ceramic that includes, in aggregate, barium oxide, calcium oxide, and an other oxide;
the other oxide includes at least one of aluminum oxide, samarium oxide, or magnesium oxide; and
the refractory metal makes up at least 50% of the low work function insert by weight.

21. The electron source of claim 20, wherein the electron emitter comprises a planar filament and the low work function insert is coupled to a surface of the planar filament.

22. The electron source of claim 21, wherein the electron emitter functions as a thermionic emitter after repeated exposure to air in non-vacuum conditions.

23. The electron source of claim 20, wherein:
the electron source comprises a plasma electron emission source;
the electron emitter comprises a cathode tube; and
the low work function insert is coupled to an interior surface of the cathode tube.

24. The electron source of claim 23, further comprising a hollow keeper electrode that surrounds the cathode tube and the low work function insert, the hollow keeper electrode having an inner diameter that exceeds an outer diameter of the cathode tube by less than 1 millimeter.

25. The electron source of claim 24, wherein the hollow keeper electrode comprises a neutral confinement conical keeper orifice plate.

26. The electron source of claim 23, further comprising a crucible co-fired with the electron emitter and the low work function insert during assembly of the electron source.

* * * * *